United States Patent [19]

Ishihara et al.

[11] Patent Number: 5,809,642
[45] Date of Patent: Sep. 22, 1998

[54] METHOD FOR DETECTING DETERIORATION OF SOLDER PASTE PRINTING

[75] Inventors: Akihiro Ishihara; Tsuyoshi Suzuki, both of Nagoya, Japan

[73] Assignee: Aiphone Co., Ltd., Japan

[21] Appl. No.: 736,278

[22] Filed: Oct. 24, 1996

[30] Foreign Application Priority Data

Mar. 29, 1996 [JP] Japan ................................ 8-075686

[51] Int. Cl.⁶ ........................................................ H05K 3/34
[52] U.S. Cl. ............................... 29/840; 29/832; 29/846; 228/180.21; 228/180.22
[58] Field of Search ........................... 29/840, 740, 832; 228/180.21, 180.22

[56] References Cited

U.S. PATENT DOCUMENTS

| | | |
|---|---|---|
| 4,084,506 | 4/1978 | Nakatani . |
| 5,373,786 | 12/1994 | Umaba . |
| 5,492,266 | 2/1996 | Hoebener et al. . |
| 5,493,075 | 2/1996 | Chong et al. . |
| 5,564,183 | 10/1996 | Satou et al. . |
| 5,623,872 | 4/1997 | Tomomatsu . |

FOREIGN PATENT DOCUMENTS 4-106459  4/1992  Japan .

Primary Examiner—Carl J. Arbes
Attorney, Agent, or Firm—Lorusso & Loud

[57] ABSTRACT

A method for detecting deterioration of solder paste printing includes defining a check pattern region on a portion of the printed circuit board PC separated from the electrical circuit, forming fine pitch check through-holes 8a in the metal mask 7 with a pitch finer than that of the electrical circuit within a region of the metal mask corresponding to the check pattern region, printing solder paste 9 onto the check pattern region through the fine pitch check through-holes of the metal mask, monitoring for defects in the printed check pattern and detecting a defect in the check pattern region before the solder paste printing onto the electrical circuit has deteriorated. The method enables maintenance of the best condition of the solder paste printing onto the electrical circuit.

11 Claims, 8 Drawing Sheets

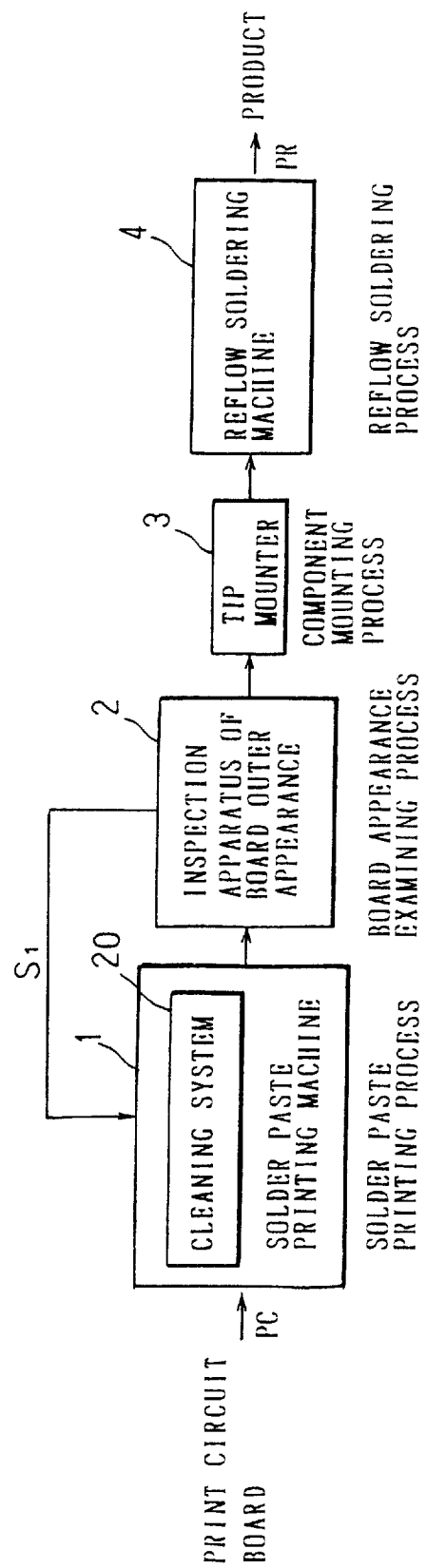

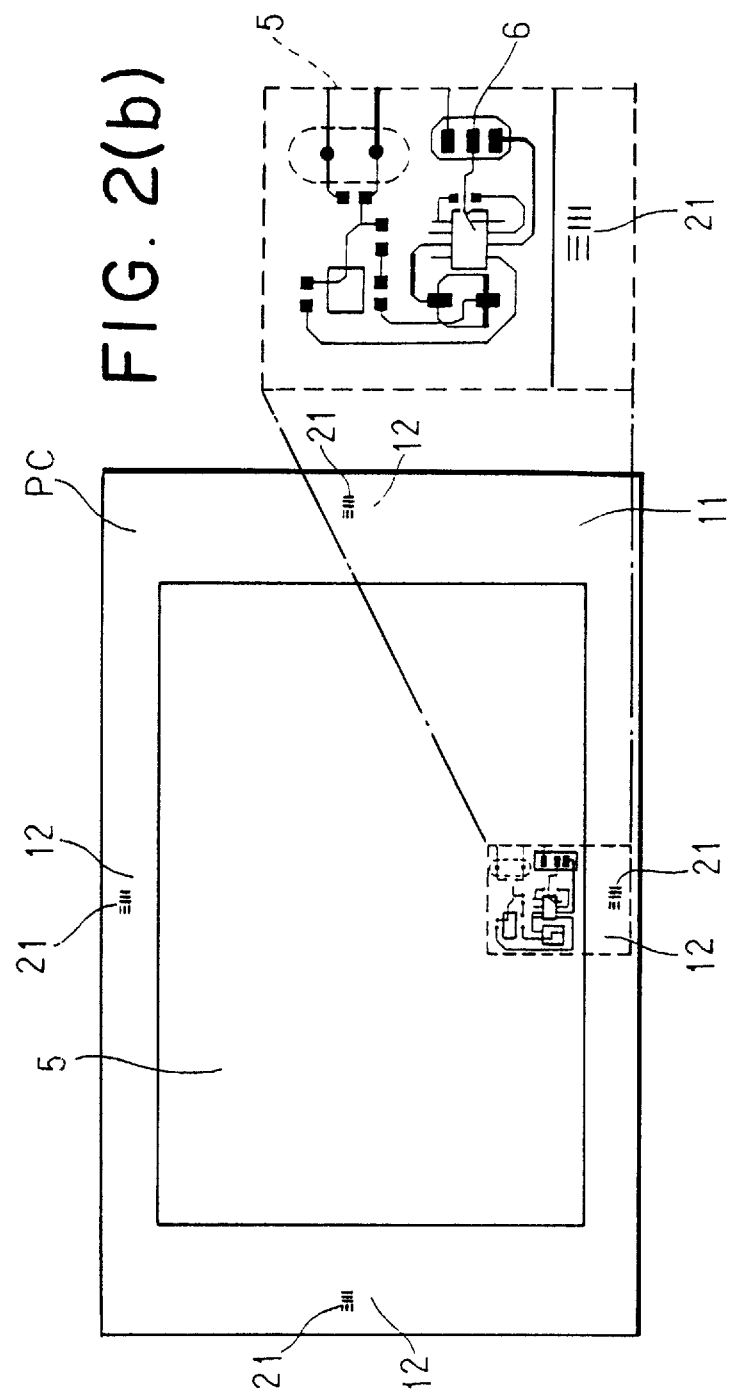

METHOD FOR DETECTING DETERIORATION OF SOLDER PASTE PRINTING

BACKGROUND OF THE INVENTION

The present invention relates to a method for detecting deterioration of solder paste printing. In particular, it relates to a method for detecting deterioration of solder paste printing wherein deterioration of solder paste printing is detected in advance and thus the best condition of solder paste printing is maintained.

In general, printed circuit boards mounting electronic components have conventionally been produced by, as shown in FIG. 8, printing solder paste on copper electrode portions of a circuit pattern, on a printed circuit board PC1, using a solder paste printing machine 31 (solder paste printing process). Tip components are mounted on the printed solder paste portions by a tip mounter 33 (component mounting process) and the tip components are subjected to reflow soldering in a reflow soldering machine 34 (reflow soldering process). Thus, a printed circuit board product PR1, including electronic components mounted on the printed circuit board PC1, is produced.

On the printed circuit board PC1 having a thickness of, for example, 1.6 mm, a circuit pattern is printed so that it can mount IC's having a pitch of 1.0 to 0.8 mm or a more finer pitch of 0.65 to 0.3 mm of a quad flat package (QFP), small outline package (SOP) or the like.

In the solder paste printing process, solder paste 9 is printed on the circuit pattern of the printed circuit board PC1, through etched through-holes 8 of a metal mask 7, by scraping with a squeegee 10 of the solder paste printing machine 31 (FIGS. 9(a) and (b)). The metal mask is composed of, for example, stainless steel and has a thickness of 100 μm–200 μm.

The solder paste 9 is composed of, as main components, 63% of tin and 37% of lead, plus rosin as a flux, a halogen activating agent such as chlorine, bromine or iodine and a thixotropic agent as an antibreaking agent. The solder paste is molten at a temperature of about 183° C. or higher in the reflow soldering machine 34 and is solid at lower temperatures.

In view of these properties of the solder paste 9, the through-holes 8 of the metal mask 7 spaced to match the pitch of the circuit pattern on the print circuit board PC1, particularly those for fine pitch QFP or SOP, are likely to become clogged with the solder paste 9. Thus, the fine pitch QFP or SOP may cause printing errors.

Therefore, the solder paste printing machine 31 is equipped with a self-cleaning system 20 comprising a solder paste filter 17a, suction machine 15 having a suction blower 18, solder paste scraper 16 and wiping blade 17, as shown in FIG. 10. When some of the through-holes 8 in the metal mask 7 become clogged with solder paste, the cleaning system 20 of the solder paste printing machine 31 must be activated to suck solder paste from the clogged through-holes 8 of the metal mask 7 by operation of the suction machine 18. In this cleaning operation a small amount of solder paste remaining adhered to the metal mask 7 is removed by scraping with the solder paste scraper 16 and wiping with the wiping blade 17.

This cleaning function is generally practiced manually by an operator or semi-automatically by setting a number of circuit boards in a counter.

In the conventional production of reflow print circuit boards, no check is performed after the solder paste printing and thus a great number of defective products have been produced after mounting electronic components and reflow soldering.

Accordingly, when deterioration of solder paste printing, printing defects or like problem is observed, the production line must be temporarily stopped and, after the cause of the defect is identified by the operator, the necessary measure such as cleaning of the printing machine is performed. Of course, identification of the cause of the defect or other problem depends on the experience of the operator.

The present invention is intended to solve the problem described above and has as its object provision of a method for detecting deterioration of solder paste printing, which can reduce the burden on the operator and can maintain the best condition of solder paste printing.

SUMMARY OF THE INVENTION

To achieve the above object, the method for detecting deterioration of solder paste printing according to the present invention comprises, in the production of printed circuit boards by printing solder paste through through-holes of a metal mask on copper electrode portions of a circuit pattern printed on a printed circuit board by a solder paste printing machine, mounting electronic components on the printed solder paste by an electronic component mounter and subjecting the printed circuit board with mounted electronic components to reflow soldering in a reflow soldering machine, defining a check pattern region on a portion of the printed circuit board separated from the circuit pattern, forming fine pitch check through-holes in the metal mask with a pitch finer than that of the circuit pattern within a region of the metal mask corresponding to the check pattern region, printing solder paste on the check pattern region through the fine pitch check through-holes of the metal mask, monitoring deterioration of printing condition in the check pattern region and detecting defects in the check pattern region before the printing of solder paste printing in the circuit pattern deteriorates.

In one embodiment of the method detecting deterioration of solder paste printing according to the present invention, the check pattern printed by solder paste printing through the fine pitch check through-holes of the metal mask is optically examined by an inspection apparatus and it is judged that the printing has deteriorated when a defect is found in the check pattern.

According to another embodiment of the method for detecting deterioration of solder paste printing, responsive to detection of a defect in the check pattern region, operation of the cleaning system of the solder paste printing machine is initiated before the solder paste printing of the circuit pattern has deteriorated. Thus, deterioration of the printing of the circuit pattern is prevented in advance to ensure stable production of products of good quality. Further, temporary stoppages of the production line are avoided and hence the productivity is improved and the burden on operators is reduced.

BRIEF DESCRIPTION OF DRAWINGS

FIG. 1 is a flowchart of the process for producing printed circuit boards with mounted components, which process includes detection of deterioration of the solder paste printing, according to the present invention.

FIG. 2 is a plan view of a printed circuit board to be examined for deterioration of the solder paste printing in accordance with the present invention, of which a portion is enlarged.

PREFERRED EMBODIMENTS OF THE INVENTION

Figure 3A:
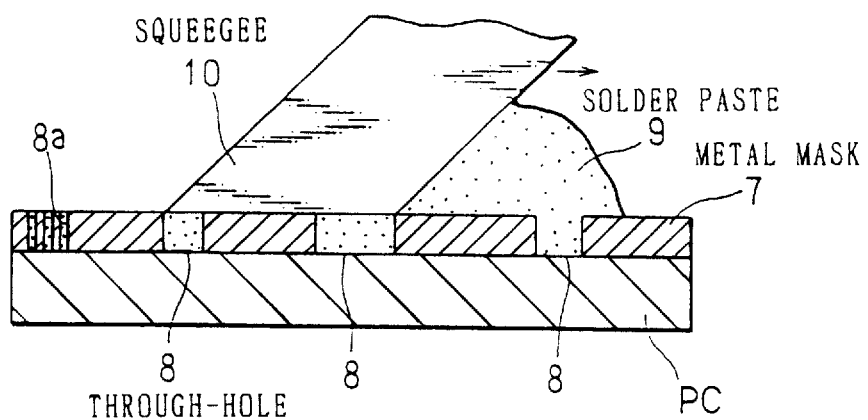
FIGS. 3(a) and (b) are partial cross-sectional views of a printed circuit board and superimposed mask, showing the squeegee of a solder paste printing machine and illustrating the process of solder paste printing, wherein the metal mask is adapted for the method for detecting deterioration of the solder paste printing of the present invention.

The preferred embodiments of the method for detecting deterioration of solder paste printing according to the present invention will now be further explained with reference to the appended drawings.

As shown in FIG. 1, a printed circuit board product PR with mounted electronic components is produced by the steps of printing solder paste on a printed circuit board PC using a solder paste printing machine 1 (solder paste printing process), examining the appearance of the printed solder printing paste by inspection of the outer surface of the board (visual tester) 2 (board appearance examining process), mounting electronic components such as tip components and IC's (not shown) on the printed solder paste by an electronic component mounter 3 (electronic component mounting process) and subjecting the printed circuit board with mounted electronic components to reflow soldering in a reflow soldering machine 4 (reflow soldering process).

Before the solder paste printing process, copper electrode portions 6 of the circuit pattern 5 have been preliminarily formed on the printed circuit board PC (FIG. 2).

The copper electrode portions 6 may be formed on the printed circuit board PC with a foil or by a conventional method such as electroplating or CVD. The copper used for the copper electrode portions 6 may be copper or a copper alloy.

The circuit pattern 5 of the printed circuit board PC is printed so that the board can mount IC's of a quad flat package (QFP), a small outline package (SOP) or the like, which are formed with a pitch of 1.0 to 0.8 mm or a finer pitch of 0.65 to 0.3 mm.

The metal mask 7 is placed on the printed board PC so that the through-holes 8 preliminarily provided in the metal mask 7 are located at positions corresponding to the copper electrode portions 6 of the circuit pattern 5. Solder paste 9 is then applied onto the metal mask 7, and the upper surface of the metal mask 7 is scraped with a squeegee 10 of a solder paste printing machine 1 (FIG. 3(a)). Thus, solder paste 9 is printed on the corresponding positions of the copper electrode portions 6 through the through-holes 8 of the metal mask 7 by the solder paste printing machine 1.

Figure 3B:
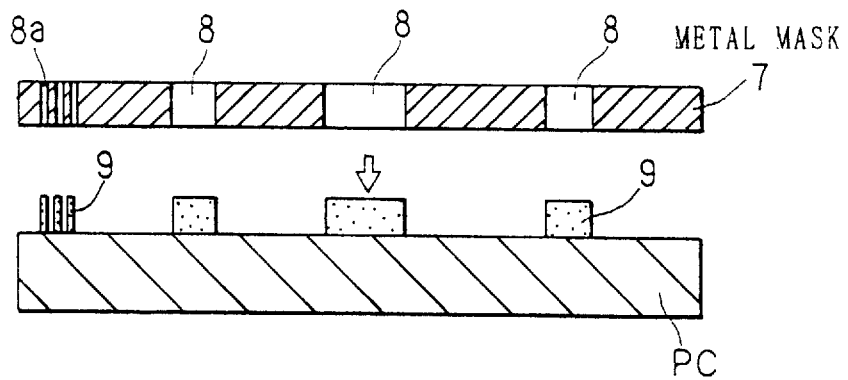

Then, the metal mask 7 is separated from the printed circuit board PC, and printed solder paste 9 remains on the copper electrode portions 6 of the circuit pattern 5 on the printed circuit board PC (FIG. 3 (b)).

On the printed circuit board PC, one or more check pattern regions 12 are defined in an area 11 separated from the circuit pattern 5 (FIG. 2). The check pattern regions 12 are preferably provided in the peripheral portions of the board, separated from the circuit pattern 5 of the printed circuit board PC. However, the check pattern region 12 may be provided inside the circuit pattern 5 of the printed circuit board PC so long as the check pattern region is separated from the circuit pattern 5.

In the metal mask 7, fine check through-holes 8a with a pitch finer than that of the circuit pattern 5 are formed in a portion corresponding to the check pattern region 12. The fine pitch check through-holes 8a are in the form of, for example, parallel lines. For example, when the circuit pattern 5 of the printed circuit board PC is designed to mount IC's of a quad flat package (QFP), a small outline package (SOP) or the like with a 0.5 mm pitch, the fine pitch check through-holes 8a of the metal mask 7 are formed with a finer pitch of 0.3 mm. The fine pitch check through-holes 8a with a pitch finer than that of the circuit pattern 5 are formed in the metal mask 7 at the position corresponding to the check pattern region 12 in the manner described above, because it was found that, in solder paste printing, the finer the pitch of the pattern, the faster the deterioration of the quality of the solder paste printing. In the method of the present invention, based on the above finding, the fine pitch check through-holes 8a with a pitch suitably finer than that of the circuit pattern 5, adapted for QFP and SOP tips, are formed in the metal mask 7 at the position corresponding to the check pattern region 12.

To that end, the solder paste 9 is printed on the copper electrode portions 6 in the circuit pattern 5 of the printed circuit board PC by solder paste printing through the through-holes 8 of the metal mask 7 using the solder paste printing machine 1 and, at the same time, the solder paste portions 9a are formed in the check pattern region 12 by solder paste printing through the fine pitch check through-holes 8a of the metal mask 7.

Deterioration of quality in printing of the printed solder paste portions 9a on the printed circuit board PC is monitored by image forming in the inspection apparatus 2 and smearing and/or blurring of the solder paste portions 9a are detected by the inspection apparatus 2 in the check pattern region 12 before deterioration of the solder paste printing on the circuit pattern 5.

Figure 5:
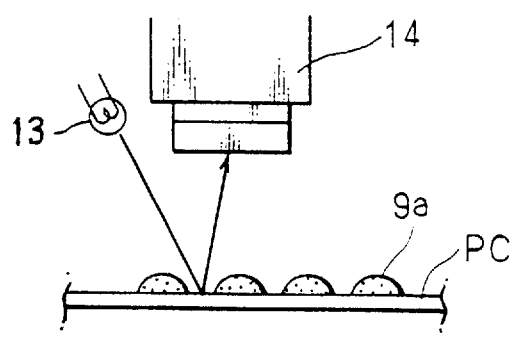
FIG. 5 is an elevational view of an inspection apparatus for inspection of board outer appearance and, in particular, the condition of solder paste printing in the method of the present invention.
Figure 6:
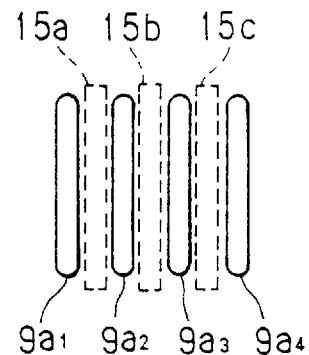
FIG. 6 is an explanatory diagram of the process for monitoring deterioration of solder paste printing condition by image forming in the inspection apparatus of FIG. 5.

The inspection apparatus 2 comprises a ring light 13 and a CCD camera 14 arranged vertically above the printed circuit board PC (FIG. 5). The light from the ring light 13 is reflected by the printed solder paste portions 9a1, 9a2, 9a3 and 9a4 (FIG. 6) and this reflected light is received by the CCD camera 14. In the obtained camera image, the solder paste portions 9a1, 9a2, 9a3 and 9a4 are represented by bright portions and other parts by dark portions. Therefore, detection windows 15a, 15b and 15c are provided between the solder paste portions 9a1, 9a2, 9a3 and 9a4.

Figure 7A:
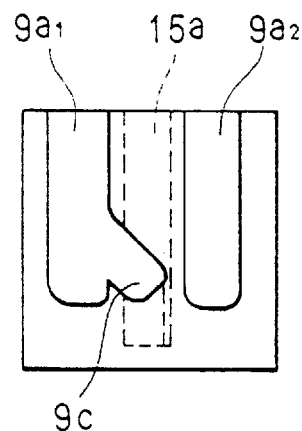
FIGS. 7(a) and (b) are additional explanatory diagrams of the process for detecting deterioration of printing condition by image forming in the inspection apparatus of FIG. 5.
Figure 7B:
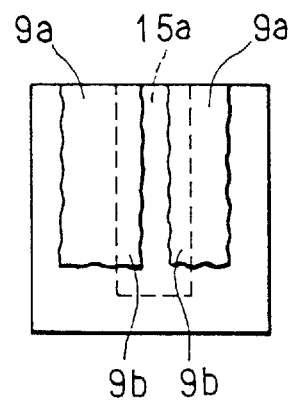
Figure 8:
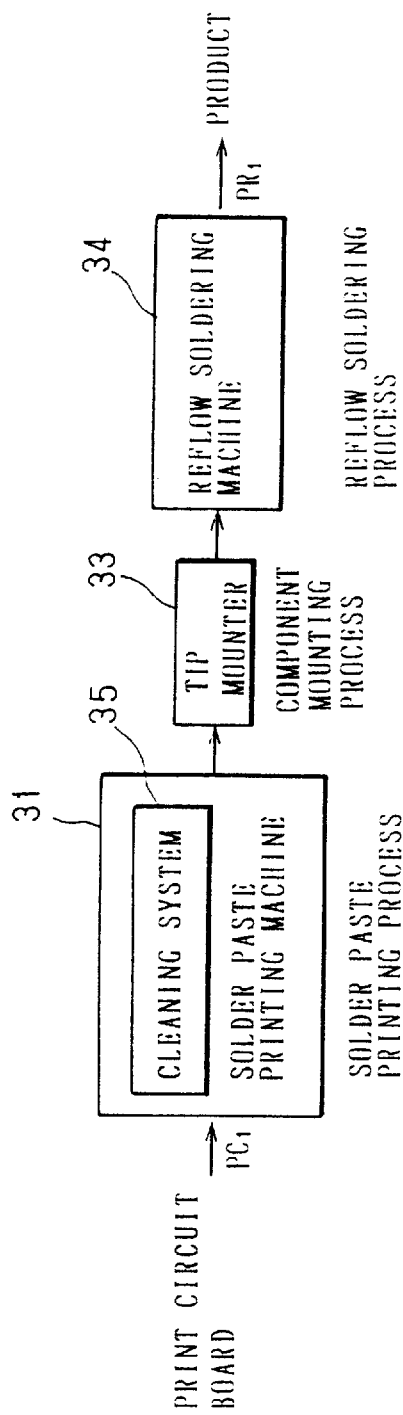
FIG. 8 is a flowchart of a conventional process for producing printed circuit boards with mounted components.
Figure 9A:
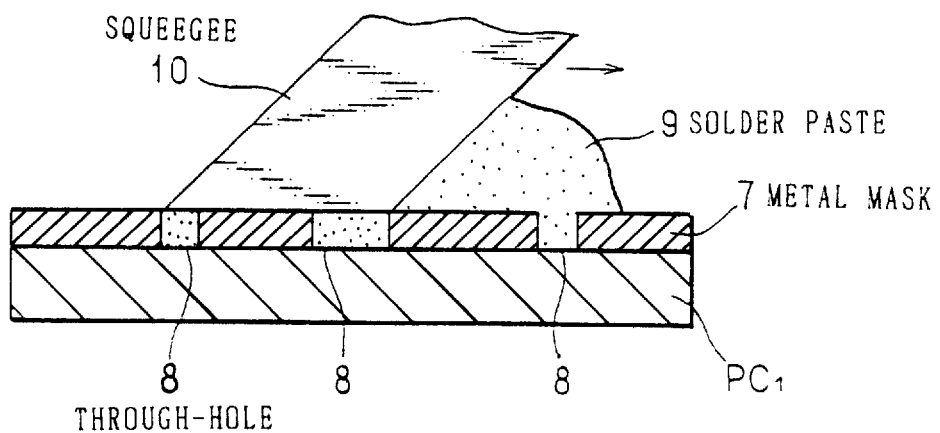
FIGS. 9(a) and (b) are partial cross-sectional views of a printed circuit board and superimposed mask, illustrating a conventional process of solder paste printing onto a printed circuit board through a metal mask.
Figure 9B:
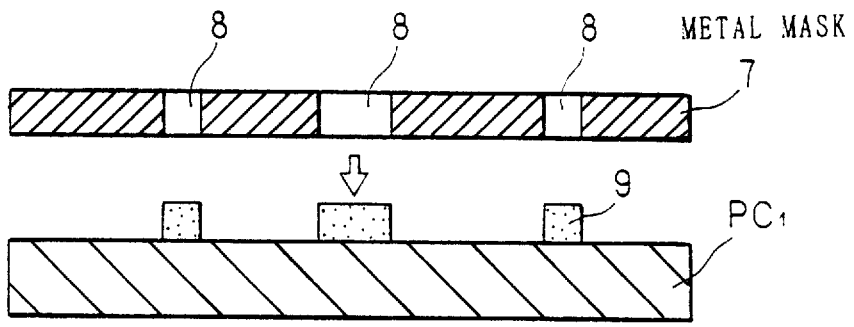
Figure 10:
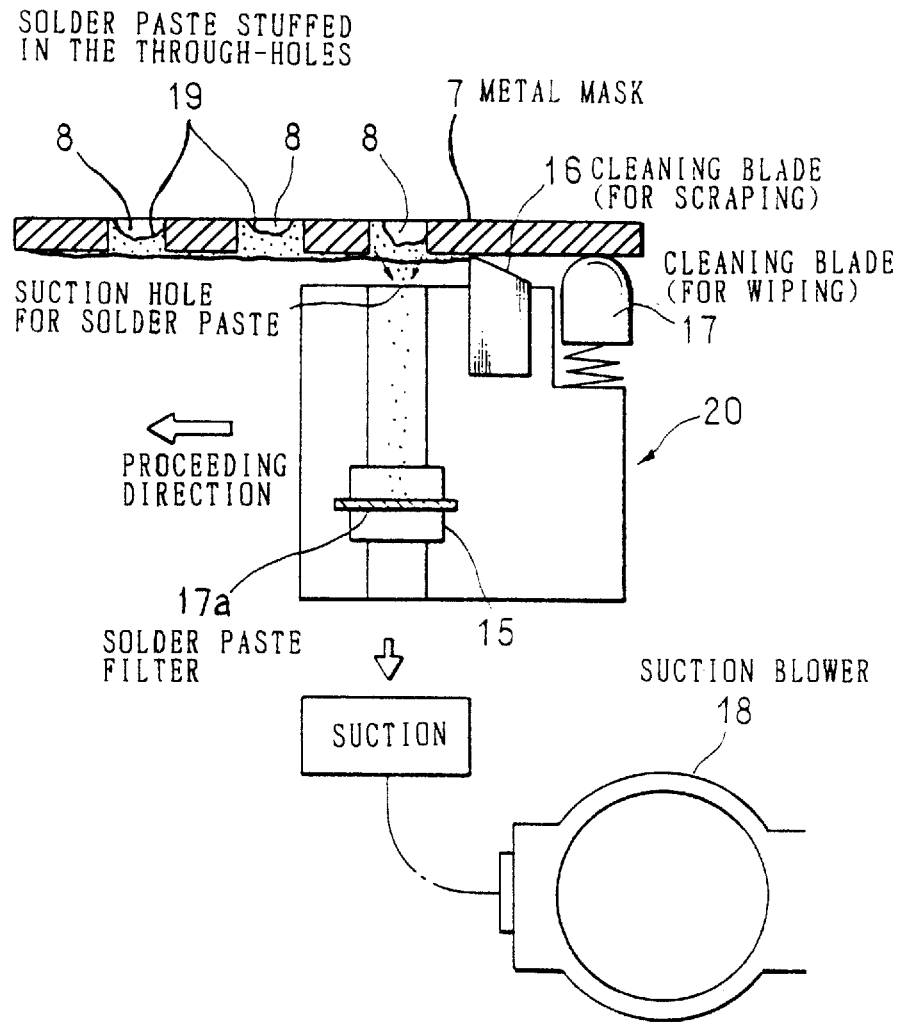
FIG. 10 is a schematic view of a cleaning system of a conventional solder paste printing machine.

When an image defect (e.g., fluctuation of average brightness), which may be caused by a incorrectly positioned part of the printed solder paste 9c shown in FIG. 7(a) or a smeared part of the printed solder paste 9b shown in FIG. 7(b), is detected over the detection windows 15a, 15b and 15c, it is judged that incorrect positioning or smearing is respectively present, and a feedback signal S1 for starting the cleaning is output to the cleaning system 20 of the solder paste printing machine 1 (FIG. 1). Upon receiving the feedback signal S1, the solder paste printing machine 1 activates the cleaning system 20 (FIG. 10) so that the solder paste 19 clogging the through-holes 8 of the metal mask 7 is removed by a suction machine 15 comprising a solder paste filter 17a and a suction blower 18. The small amount of solder paste 19 remaining adhered to the surface of the metal mask is scraped by the solder paste scraper 16, and wiped with the wiping blade 17.

In the manner described above, deterioration of the condition of the solder paste portion 9a printed on the print circuit board PC is monitored by image forming in the inspection apparatus 2. Smearing and/or blurring of the solder paste portions 9a are likewise detected by the inspection apparatus 2. Thus, deterioration of the condition of the solder printing in check pattern region 12 is detected before the solder paste printing on the circuit pattern 5 of the print circuit board PC becomes deteriorated. Further, when a defect (FIG. 7) is detected, the metal mask is cleaned by the cleaning system 20 of the solder paste printing machine 1 so as to constantly maintain the optimum conditions for solder paste printing.

A check pattern 21 may be printed with a pitch finer than that of the circuit pattern 5 on an area of the print circuit board PC separated from the circuit pattern 5 as shown in FIG. 2. For this purpose, fine pitch check through-holes 8a corresponding to the check pattern 21 are formed in the metal mask 7 and solder paste portions 9a are printed by solder paste printing through the fine pitch check through-holes 8a of the metal mask 7 as shown in FIG. 3.

The check pattern 21 printed by solder paste printing through the fine pitch check through-holes 8a of the metal mask 7 is monitored by the inspection apparatus 2 and, when a defect (FIG. 7) in the check pattern 21 is detected, it is judged that the printing has deteriorated and the cleaning system 20 of the solder paste printing machine 1 is activated to clean the metal mask 7.

Figure 4:
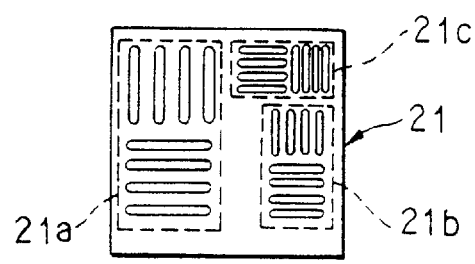
FIG. 4 is a plan view of check patterns formed with different pitches so that a pattern with a suitably finer pitch can be selected in the method for detecting deterioration of the solder paste printing of the present invention.

Further, as shown in FIG. 4, check patterns 21a, 21b and 21c which are different from each other in their pitch may be provided so that a pitch suitably finer than that of the circuit pattern 5 can be selected. In this case, the fine pitch check through-holes 8a are provided in the metal mask 7 with a pitch corresponding to that of each of check patterns 21a, 21b and 21c.

Though the fine pitch check through-holes are provided in the form of parallel lines in the example described above, the method for detecting deterioration of solder paste printing of the present invention may be practiced using pitch check through-holes in the form of crossed lines or circles with the same advantages obtained as in the example described above.

As is apparent from the above description, by the method for detecting deterioration of solder paste printing according to the present invention, based on detection of a defect in the check pattern region, deterioration of the quality of solder printing onto the electrical circuit pattern can be predicted in advance, and can be avoided, thereby ensuring stable production of products with good quality. Further, temporary stoppage of the production line may be avoided and hence the productivity is improved and the burden on the operators is reduced.

What is claimed is:

1. A method for detecting deterioration in quality of solder paste printing of a first pattern of solder shapes through a mask onto a circuit board, said first pattern of solder shapes having a first pitch and being in electrical contact with an electrical conductor having a composition different from said solder and printed as an electrical circuit on said circuit board, said method comprising:

printing a second pattern of solder shapes through said mask and onto said circuit board, said second pattern of solder shapes having a second pitch finer than said first pitch and being confined to an area on said circuit board separated from said electrical circuit and from first pattern of solder shapes; and inspecting said second pattern of solder shapes to detect a defect, detection of a defect in said second patter of solder shapes preceding deterioration in said quality of solder paste printing.

2. The method of claim 1 further comprising:

cleaning said mask responsive to detection of a defect in said second pattern of solder shapes.

3. The method of claim 1 further comprising, prior to said inspecting:

mounting electronic components on respective solder shapes of said first pattern; and subjecting the printed circuit board with mounted electronic components to reflow soldering.

4. The method of claim 1 wherein said inspecting is optically and automatically performed by an inspection apparatus.

5. The method of claim 4 wherein said inspection apparatus includes plural detection windows and wherein said method further comprises aligning the detection windows with spaces between the solder shapes of said second pattern.

6. The method of claim 4 further comprising:

cleaning said mask responsive to detection of a defect in said second pattern of solder shapes.

7. The method of claim 5 further comprising:

cleaning said mask responsive to detection of a defect in said second pattern of solder shapes.

8. The method of claim 1 wherein the solder shapes of said second pattern comprise a set of parallel straight lines.

9. The method of claim 2 wherein the solder shapes of said second pattern comprise a set of parallel straight lines.

10. The method of claim 5 wherein the solder shapes of said second pattern comprise a set of parallel straight lines.

11. The method of claim 1 wherein said electrical conductor is copper and said solder paste comprises a metal portion consisting essentially of tin and lead.

* * * * *

UNITED STATES PATENT AND TRADEMARK OFFICE
CERTIFICATE OF CORRECTION

PATENT NO. : 5,809,642
DATED : September 22, 1998
INVENTOR(S) : ISHIHARA et al

It is certified that error appears in the above-indentified patent and that said Letters Patent is hereby corrected as shown below:

Col. 2, line 20, delete ", in".

Col. 6, line 24, "patter" should read --pattern--.

Signed and Sealed this

Tenth Day of August, 1999

Attest:

Attesting Officer

Q. TODD DICKINSON

Acting Commissioner of Patents and Trademarks